United States Patent
Hanson et al.

(10) Patent No.: US 11,018,220 B2
(45) Date of Patent: May 25, 2021

(54) DEVICE ISOLATION DESIGN RULES FOR HAST IMPROVEMENT

(71) Applicant: MACOM Technology Solutions Holdings, Inc., Lowell, MA (US)

(72) Inventors: Allen W. Hanson, Cary, NC (US); Wayne Mack Struble, Franklin, MA (US); John Claassen Roberts, Hillsborough, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/957,042

(22) Filed: Apr. 19, 2018

(65) Prior Publication Data

US 2018/0308927 A1 Oct. 25, 2018

Related U.S. Application Data

(60) Provisional application No. 62/487,194, filed on Apr. 19, 2017.

(51) Int. Cl.
| | | |
|---|---|---|
| *H01L 29/06* | (2006.01) | |
| *H01L 27/06* | (2006.01) | |
| *H01L 29/20* | (2006.01) | |
| *H01L 23/31* | (2006.01) | |
| *H01L 21/56* | (2006.01) | |
| *H01L 21/761* | (2006.01) | |

(Continued)

(52) U.S. Cl.
CPC .......... *H01L 29/0646* (2013.01); *H01L 21/56* (2013.01); *H01L 21/761* (2013.01); *H01L 23/3171* (2013.01); *H01L 27/0605* (2013.01); *H01L 29/2003* (2013.01); *H01L 33/0095* (2013.01); *H01L 21/8252* (2013.01)

(58) Field of Classification Search
CPC ............. H01L 27/0605; H01L 23/3171; H01L 29/7846; H01L 29/0646
See application file for complete search history.

(56) References Cited

U.S. PATENT DOCUMENTS

| 8,664,090 B1 * | 3/2014 | Nangalia ................. H01L 21/78 257/737 |
| 2005/0145851 A1 * | 7/2005 | Johnson ............ H01L 21/28587 257/76 |

(Continued)

OTHER PUBLICATIONS

International Search Report and Written Opinion dated Aug. 14, 2018 in connection with International Application No. PCT/US2018/028280.

(Continued)

*Primary Examiner* — Shih Tsun A Chou

(74) *Attorney, Agent, or Firm* — Thomas | Horstemeyer, LLP.; Jason M. Perilla

(57) ABSTRACT

Structures and methods for isolating semiconductor devices and improving device reliability under harsh environmental conditions are described. An isolation region may be formed by ion implantation in a region of semiconductor surrounding a device. The implantation region may extend into streets of a wafer. A passivation layer may be deposited over the implantation region and extend further into the streets than the isolation region to protect the isolation region from environmental conditions that may adversely affect the isolation region.

18 Claims, 4 Drawing Sheets

(51) Int. Cl.
    *H01L 33/00*    (2010.01)
    *H01L 21/8252*  (2006.01)

(56) References Cited

U.S. PATENT DOCUMENTS

| | | | |
|---|---|---|---|
| 2006/0273347 A1* | 12/2006 | Hikita | H01L 29/66462 |
| | | | 257/192 |
| 2009/0166678 A1* | 7/2009 | Sato | H01L 21/8252 |
| | | | 257/194 |
| 2016/0064362 A1* | 3/2016 | Bonart | H01L 25/16 |
| | | | 257/622 |
| 2016/0204074 A1* | 7/2016 | Lin | H01L 21/784 |
| | | | 257/76 |
| 2016/0372587 A1* | 12/2016 | Tsuchiya | H01L 29/7787 |

OTHER PUBLICATIONS

Invitation to Pay Additional Fees for Application No. PCT/US2018/028280 dated Jun. 22, 2018.

International Preliminary Report for Patentability for International Application No. PCT/US2018/028280, dated Oct. 31, 2019.

\* cited by examiner

DEVICE ISOLATION DESIGN RULES FOR HAST IMPROVEMENT

RELATED APPLICATION DATA

This application claims priority to U.S. provisional application No. 62/487,194, titled "Device Isolation Design Rules for HAST Improvement," filed Apr. 19, 2017, which application is herein incorporated by reference in its entirety.

BACKGROUND

Technical Field

The technology relates to device isolation for integrated circuits and improving device reliability and resistance to humid environments.

Discussion of the Related Art

Among several commercially-suitable semiconductors, gallium-nitride semiconductor material has received appreciable attention in recent years because of its desirable electronic and electro-optical properties. Gallium nitride (GaN) has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, gallium nitride is more resistant to avalanche breakdown and has a higher intrinsic field strength compared to more common semiconductor materials, such as silicon and gallium arsenide. In addition, gallium nitride is a wide bandgap semiconductor and is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are desirable for making semiconductor amplifiers for radio-frequency (RF) communications, radar, and microwave applications.

Although GaN is a desirable semiconductor material for many applications, it is more expensive to produce than conventional silicon or gallium arsenide semiconductor wafers, for example. One approach to producing GaN for semiconductor device manufacture is to epitaxially overgrow a layer of GaN on a wafer made of a different material, such as silicon, silicon carbide, or sapphire. Although epitaxial overgrowth can reduce the cost of semiconductor substrates comprising device-grade GaN or other types of semiconductor materials, there can still exist challenges in producing reliable, long-life devices such as transistors, diodes, and integrated optoelectronic devices.

SUMMARY

Structures and methods for improving semiconductor device reliability are described. In some embodiments, isolation regions for active devices are formed by implanting ions into a semiconductor region surrounding a device. The implantation may damage the crystal structure and form an electrically-insulating barricade around the device. The isolation region can extend into "streets" of a wafer and provide some protection for the device during device singulation. A passivation layer can extend over the isolation region farther into the street than the isolation region, so that the isolation region is not exposed to environmental conditions, such as a highly humid environment which could otherwise adversely affect the isolation region and compromise device reliability.

Some embodiments relate to a semiconductor wafer comprising a substrate formed from a first material, a first device area on the semiconductor wafer containing an integrated circuit device, a street extending between the first device area and a second device area, an isolation region extending partially or fully around the integrated circuit device, and one or more passivation layers extending over the isolation region into the street farther than the isolation region extends into the street.

Some embodiments relate to a semiconductor die comprising a substrate formed from a first material, an integrated circuit device formed on the semiconductor die, an isolation region extending partially or fully around the integrated circuit device, and one or more passivation layers extending over the isolation region toward an edge of the semiconductor die farther than the isolation region extends toward the edge of the semiconductor die.

Some embodiments relate to a method of forming an integrated circuit device, the method comprising forming an integrated circuit device in a device area on a wafer, wherein the device area is bounded by at least one street; forming an isolation region partially or fully surrounding the integrated circuit device and bordering a first street of the at least one street; and forming at least one passivation layer that covers the isolation region and extends farther toward the first street than the isolation region.

Some embodiments relate to a semiconductor wafer comprising a substrate formed from a first material, a first device area on the semiconductor wafer containing an integrated circuit device, a street extending between the first device area and a second device area, one or more passivation layers extending over at least a portion of the integrated circuit device toward the street, and an isolation region extending partially or fully around the first device area and lying entirely outside a region covered by the one or more passivation layers.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Integrated semiconductor devices formed from semiconductors other than silicon can offer significant improvements in device performance such as higher breakdown voltages, higher power-handling capability, and/or higher speed. Although silicon is well established in the semiconductor and integrated circuit industry, and is relatively low in cost to manufacture in large wafer sizes (e.g., 250-mm-diameter wafers and larger), the same is not true for other desirable semiconductors such as gallium nitride (GaN), cadmium telluride (CdTe), and indium phosphide (InP), among others. In some cases, a desirable semiconductor may be epitaxially grown or bonded over bulk silicon or other substrate materials including, but not limited to, sapphire and silicon carbide. High performance integrated-circuit devices may then be made using microfabrication processes on one or more epitaxial layers. For example, high performance power amplifiers (such as Doherty amplifiers that can handle 10's and 100's of Watts at multi-gigahertz frequencies) may be formed in GaN epitaxial layers grown on a bulk silicon substrate.

Figure 1:
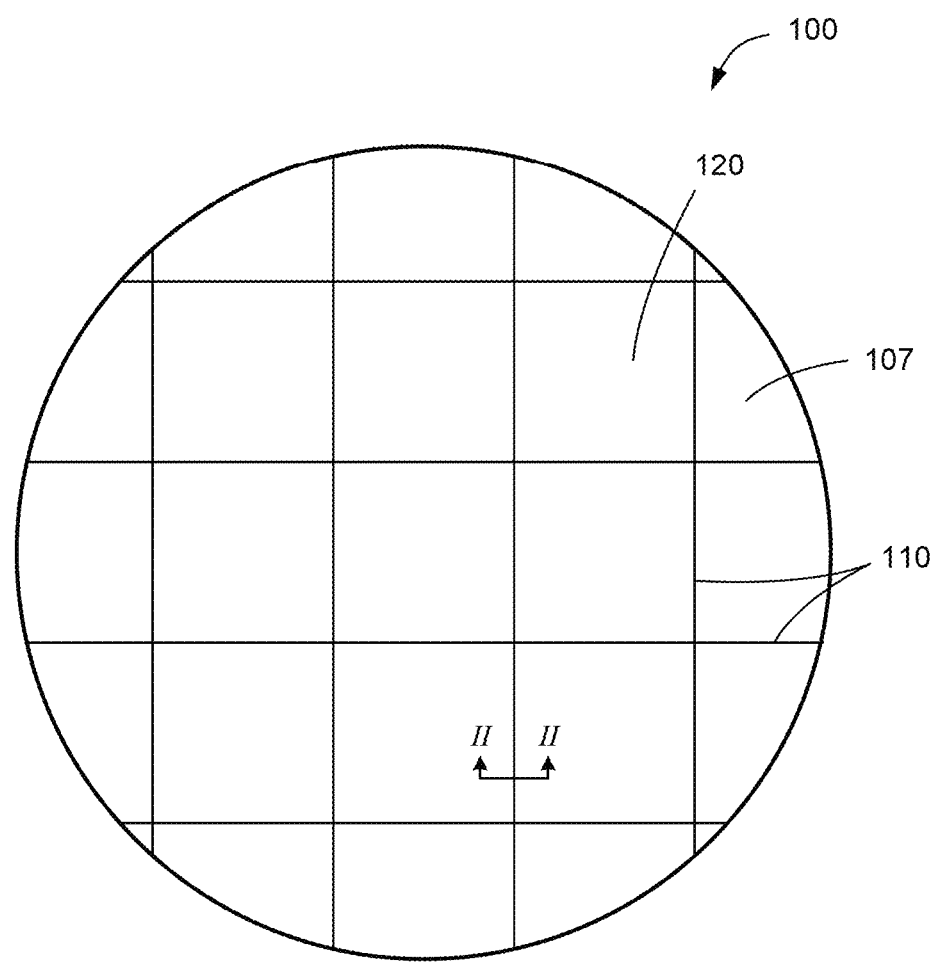
FIG. 1 depicts a wafer having a plurality of streets.

Referring to FIG. 1, a plurality of similar or identical integrated circuit devices (not shown) may be formed in device areas 120 on a wafer 100. The integrated devices may be formed from at least one epitaxial layer 107 that has been grown over a bulk substrate material. Integrated circuit devices can comprise various components such as, and without being limited to, integrated transistors, diodes, amplifiers, capacitors, resistors, inductors, and interconnects. In some cases, each device area 120 may contain one integrated circuit device. In other cases, there can be multiple integrated circuit devices within each device area 120. Examples of an integrated circuit device include, but are not limited to, a microcontroller, a microprocessor, a power amplifier, an application-specific integrated circuit, field-programmable gate array, a transceiver, a memory array, etc.

Between the device areas 120, there may be streets 110 that are mainly devoid of integrated circuit structure. The streets 110 allow for subsequent cutting and singulation of the integrated devices. In some cases, etching or cleaving may be used to separate the integrated devices. The singulation may form a die from each device area 120 (nine die for the depiction shown in FIG. 1, though there may be 10's or 100's of dies from a large wafer).

Figure 2:
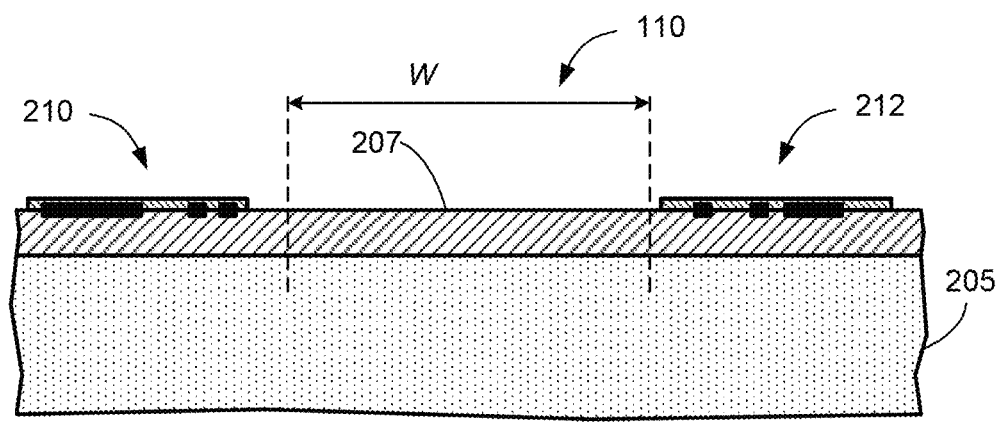
FIG. 2 depicts a cross-sectional view of a portion of a wafer near a street, according to an embodiment.

A more detailed depiction of a region of a wafer 100 near a street 110 is shown in FIG. 2. The dashed lines indicate an approximate width W or span of the street 110, which may be between 30 microns and 100 microns in some cases, though larger widths may be used in other cases (e.g., as much as 1 mm). There may be a first integrated device 210 fabricated in a first device region formed to one side of the street 110 and a second integrated device 212 fabricated in a second device region formed at an opposite side of the street 110. The integrated devices may be formed from at least a portion of at least one epitaxial layer 207 on a bulk substrate 205. Some embodiments may include devices formed from multiple epitaxial layers on a substrate 205. Other embodiments may have no epitaxial layers, and devices may be formed in the substrate 205.

Figure 3:
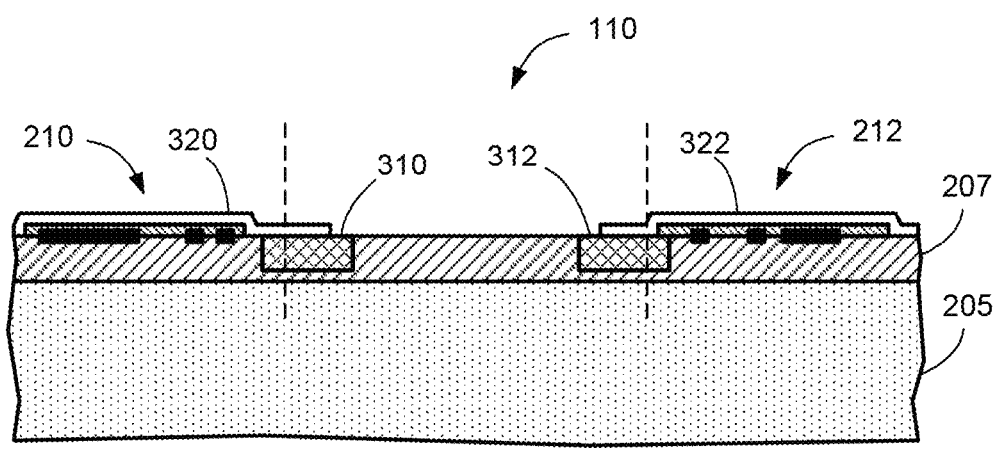
FIG. 3 depicts a cross-sectional view of a portion of a wafer near a street that includes isolation regions and passivation layers, according to some embodiments.

During singulation, the substrate 205 and epitaxial layer(s) 207 may be cut, cleaved, etched, laser cut, or otherwise separated along the street 110. Because singulation can subject the integrated devices 210, 212 to a harsh environment, measures may be taken to protect the devices during singulation. Referring to FIG. 3, one measure of protection is to form at least one passivation layer 320, 322 over at least a portion of each integrated device 210, 212. A passivation layer may be formed from silicon nitride ($SiN_x$), for example, though other materials may be used additionally or alternatively, such as, but not limited to, benzocyclobutene (BCB), polyimide, an oxide ($SiO_x$), etc. The passivation layer(s) 320, 322 may protect the integrated devices 310, 312 from debris and/or chemicals associated with device singulation.

The inventors have recognized and appreciated that it is undesirable to cut through the passivation layers 320, 322 during device singulation. Cutting through the passivation layers can cause delamination of the passivation layers and lead to device degradation, failure, or damage. Accordingly, it is beneficial to keep the edges of the passivation layers 320, 322 near the street boundaries (e.g., near the dashed lines in FIG. 3) and away from a central region of the street 110 where the cutting, cleaving, or other mode of separating occurs.

Another measure to protect the devices from charging and current flow during singulation comprises forming isolation regions 310, 312 around the devices 210, 212 that do not entirely cross or cover the streets 110. In some cases, the isolation regions 310, 312 may be formed mainly to define active areas of devices and/or enhance device performance (e.g., to reduce leakage currents in a device), and may not be added for device protection during singulation. In some implementations, the isolation regions 310, 312 can serve dual purposes of enhancing device performance and protecting the device during singulation.

The isolation regions may comprise an electrically-insulating barricade that extends around the devices. The isolation regions 310, 312 may extend from an upper most epitaxial layer 207 toward the substrate 205, and may extend through one or more buried epitaxial layers (not shown in FIG. 3). In some cases, the isolation regions 310, 312 may extend into the substrate 205.

The inventors have recognized and appreciated that device singulation can create sizable current flow and/or charging in the vicinity of the streets 110. The isolation regions 310, 312 can protect the integrated devices 210, 212 from excessive charging and potential breakdown. The inventors have also recognized and appreciated that it is desirable to maintain some electrical conductivity along the streets 110 to dissipate charge and current away from the devices during singulation. Accordingly, the isolation regions 310, 312 may not extend all the way across the streets 110, in some embodiments, as depicted in FIG. 3.

According to some embodiments, the isolation regions 310, 312 may be formed by ion implantation. As an example, ionized nitrogen $N_2^+$ may be accelerated at one or more values of high voltage into the epitaxial layer 207 to damage the semiconductor's crystalline lattice over a range of depths. The damaged lattice becomes electrically insulating, having a conductivity that may be between 0.1 and $10^{-4}$ of the conductivity of the surrounding semiconductor. Other ion species (such as, but not limited to, argon, boron, or phosphorus) may be used for ion implantation and isolation in some embodiments. In some implementations, the isolation regions 310, 312 may be formed by other processes, such as a shallow trench isolation process. The isolation regions 310, 312 may each partially or fully surround their respective integrated devices 210, 212. For example, the isolation regions may each extend around at least two sides of the integrated devices. In some cases, the isolation regions 310, 312 may each partially or fully surround the device areas in which the integrated devices 210, 212 are formed, so that the isolations regions will be located at a periphery of a die containing a device area when singulated from the wafer.

Figure 4A:
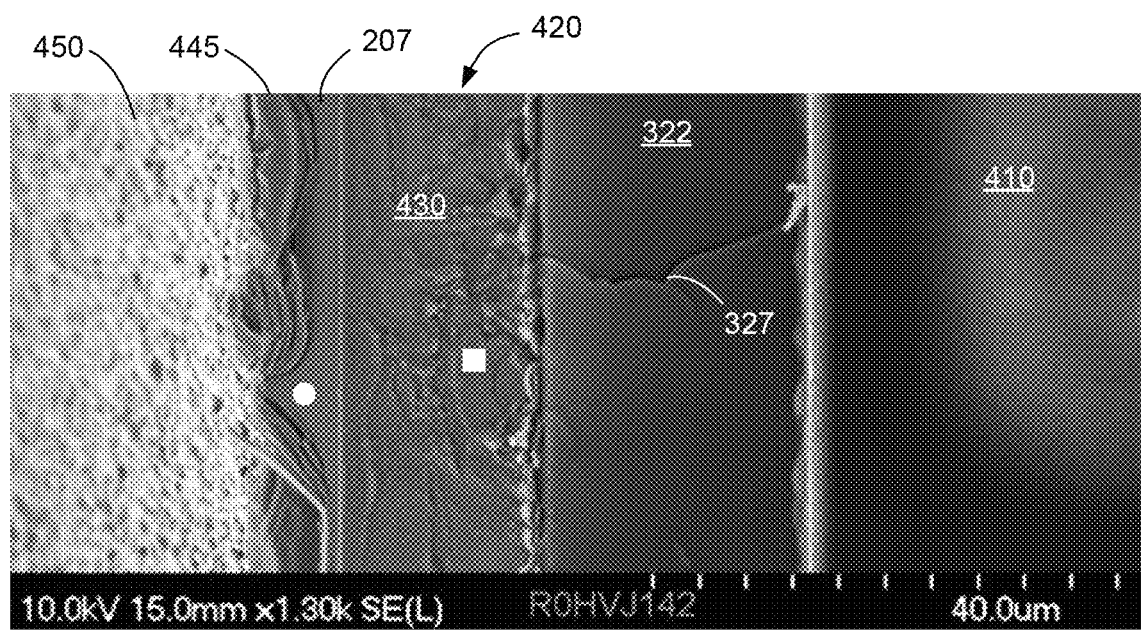
FIG. 4A is a scanning electron microscope (SEM) image showing a portion of a device near a die edge.

The inventors have discovered a potential problem when a wafer 100 having the structure depicted in FIG. 3 is singulated and the die are subsequently subjected to a high humidity environment (e.g., >50% relative humidity). The problem can become noticeable when a device is subjected to a highly-accelerated stress test (HAST). As an example, the scanning-electron microscope image of FIG. 4A shows a small edge region of a die having structure like that depicted in FIG. 3 that has been singulated and subjected to a highly-accelerated stress test under electrical bias and elevated pressure. The image shows portions of a drain bond pad 410 of a transistor (not shown) formed on the die, a passivation layer 322 overlying an isolation region, a region 420 corresponding to the isolation region adjacent to the passivation layer, and an epitaxial layer 207 within a former street. In this case, the epitaxial layer is GaN, the isolation region was formed by implantation of $N_2^+$ ions, and the passivation layers comprises silicon nitride. The die edge 445 was formed by cutting (using a diamond saw), and the die was bonded to a metal flange (not shown) with an adhesive 450.

There are two notable features in the micrograph of FIG. 4A. A first notable feature is a crack 327 that runs across and through the passivation layer 322. Inspection of larger areas and inspections of cross sections in the same region show multiple cracks and delaminations form along the passivation layer 322 over the isolation region, even though the edge of the passivation layer 322 is about 20 microns away from the region of the street that was cut. These cracks and delaminations are undesirable and can allow ingress of water to a device compromising device operation or reliability.

A second notable feature in the micrograph of FIG. 4A is a roughness of the adjacent region 420 compared to the original surface of the epitaxial layer 207, which did not undergo ion implantation. Although the original surface is smooth, the surface of the ion implantation region appears significantly rough which normally does not occur from ion implantation. The roughness suggests a transformation of the GaN material.

Figure 4B:
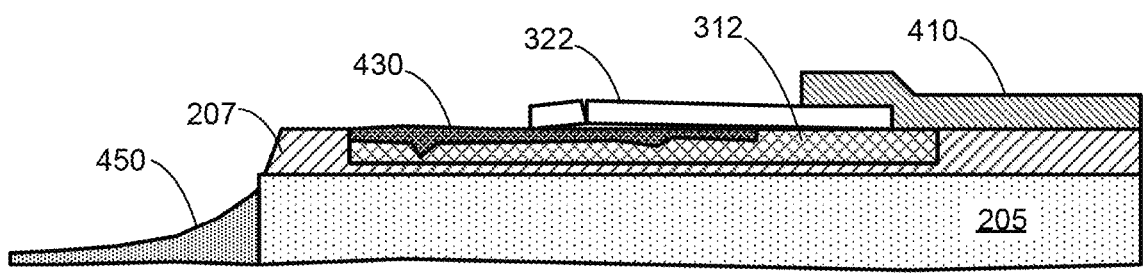
FIG. 4B depicts a cross-sectional view of structure corresponding to the SEM image of FIG. 4A.

The inventors postulated that under the highly humid environment of a HAST test, the application of an electrical bias (e.g., 50 volts) to the device's drain bond pad promotes oxidation of the ion-implanted GaN isolation regions. Referring to FIG. 4B, an oxide (e.g., $GaO_x$) 430 may form initially at areas of the isolation region 312 that are exposed to the ambient environment. The oxide may encroach inward under the passivation layer(s) 322 as more GaN is converted to an oxide. The conversion of the ion-implanted GaN to an oxide results in a change of volume of the former GaN material. The change in volume causes material stresses that are relieved by cracking and delamination of the passivation layer 322.

Figure 5:
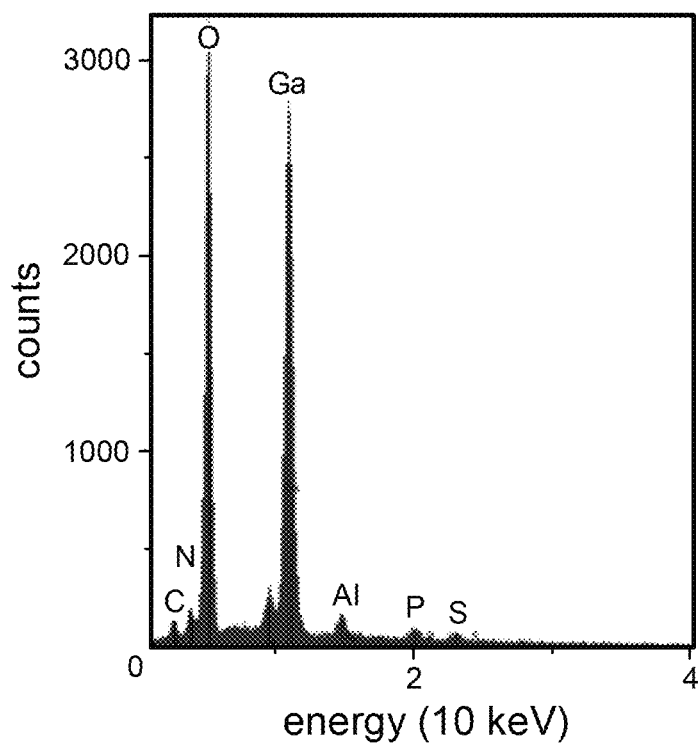
FIG. 5 is an energy dispersive x-ray spectrum recorded for a region of the sample shown in FIG. 4A marked by the white square and indicates oxide formation.
Figure 6:
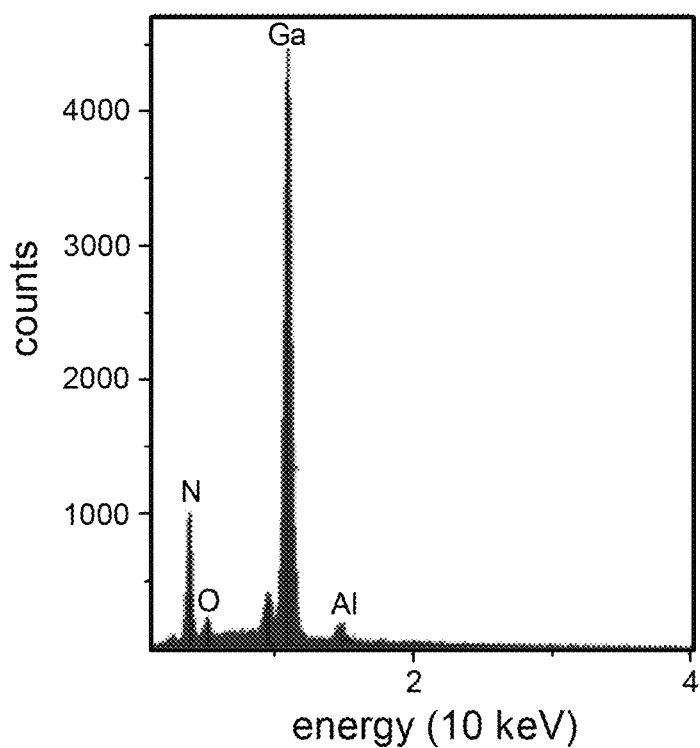
FIG. 6 is an energy dispersive x-ray spectrum recorded for a region of the sample shown in FIG. 4A indicated by the white circle.

Energy dispersive x-ray spectroscopy was carried out to examine the suspected oxide 430 and the original epitaxial layer 207. FIG. 5 shows an energy-dispersive x-ray spectrum measured from a spot of the oxide 430 indicated by the white square in FIG. 4A. The spectrum of FIG. 5 shows a strong presence of oxygen. In comparison, an energy-dispersive x-ray spectrum measured from a spot of the undamaged GaN (indicated by the white circle in FIG. 4A) shows an increased presence of nitrogen and reduced presence of oxygen. The results of FIG. 5 and FIG. 6 support a conclusion that ion-implanted GaN can form an oxide under bias in highly humid environments. The inventors have also observed that oxidation is prominent in regions of a device where the internal electrical fields due to biasing of the device are higher. In regions of the die that were not under bias, the oxide was not observed. Accordingly, the inventors have recognized a problem of device degradation near the die periphery and discovered a cause of the problem—oxide formation in an exposed ion-implanted semiconductor and lateral ingress and disruption of passivating layers.

Figure 7:
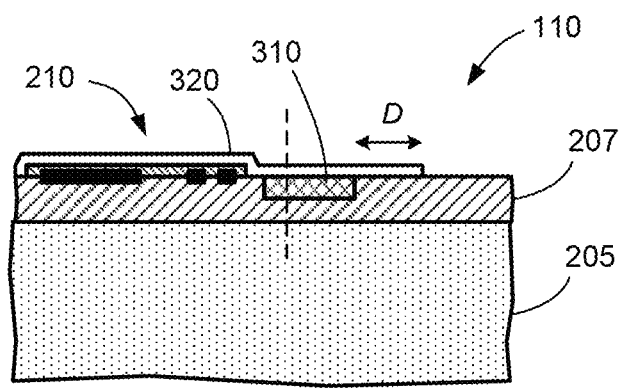
FIG. 7 is a cross-sectional view of a portion of a wafer having a protected isolation region, according to some embodiments.
Figure 8:
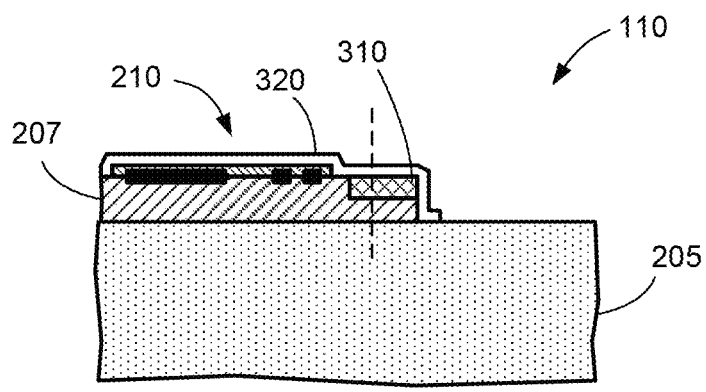
FIG. 8 is a cross-sectional view of a portion of a wafer having a protected isolation region, according to some embodiments.

According to some embodiments, the isolation region and passivating layer(s) may be engineered in the vicinity of the street boundary to prevent oxidation of the isolation region, as depicted in FIG. 7 and FIG. 8. For example, the passivation layer(s) 320 may extend toward or into the street 110 farther than the isolation region 310 by a distance D, as depicted in FIG. 7. In some embodiments, the distance D may be between 250 nanometers (nm) and 5 microns (μm). In some embodiments, the distance D may be between 1 μm and 3 μm. In some embodiments, the distance D may be between 1.5 μm and 50 μm. Additionally, the passivation layer(s) may not extend into a central region of a street at which the wafer is cut, etched, or otherwise separated.

In some embodiments, one or more epitaxial layers 207 in which an isolation region 310 is formed may be etched back within the street, as depicted in FIG. 8. For example, the etched region may remove one or more epitaxial layers and extend to the substrate 205 or into the substrate, though it need not extend all the way to the substrate in some cases. The etching may involve masking off the device areas using photolithography, for example, and etching exposed stripes within the streets 110 using reactive ion etching or a wet chemical etching process. Isolation regions 310 may extend to an edge of the etched region (as depicted in FIG. 8), or may terminate near a street boundary without reaching an edge of the etched region. Subsequently, one or more passivation layers 320 may be applied using a conformal deposition process, such as plasma-enhanced chemical-vapor deposition. A conformal deposition process can cover vertical sidewalls and shield the isolation region 310 from a humid environment. As a result, a passivation layer 320 may be formed on two intersecting surfaces (e.g., sidewall and top surface) of an isolation region 310. A benefit of the embodiment shown in FIG. 8 is that it may allow for protection of the isolation region in narrow streets. Also, a cutting device will not contact or directly stress the epitaxial layer(s) 207. When a die is singulated from a wafer having the structure shown in FIG. 7 or FIG. 8, the die can include one or more isolation regions 310 near a periphery of the die that may extend around part or all of the periphery of the die. In embodiments, such isolation regions 310 can be encapsulated fully by a passivation layer 320.

Figure 9:
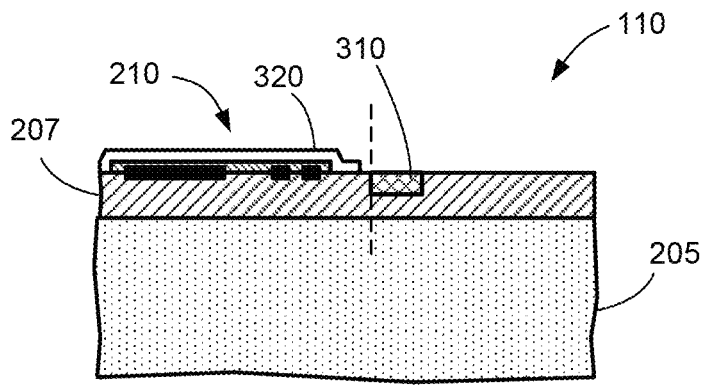
FIG. 9 is a cross-sectional view of a portion of a wafer having an isolation region lying outside a passivation layer, according to some embodiments.

In some embodiments, a structure shown in FIG. 9 may be used. In such embodiments, isolation regions 310 may be formed near or along street boundaries and lie outside the region covered by passivation layer(s) 320. There can still be a region nearer the middle of the street 110 that does not include the isolation region 310, so that current can flow along the street (e.g., during device singulation). In some cases, the isolation regions 310 lie entirely outside the region covered by passivation layer(s) 320, as depicted. In some cases, the isolation regions 310 lie mostly outside the region covered by passivation layer(s) 320, though there may be a small amount of overlap (e.g., less than 2 microns) with the passivation layers(s) 320. Although the exposed isolation region 310 may oxidize, it will not adversely affect the passivation layer 320. For the structure shown in FIG. 9, singulation of a die may remove all or some of the isolation region 310 from a periphery of the die.

In practice, integrated circuit devices and dies may be over-molded when packaged. Although over-molding can provide a lower cost method for packing devices, an over-molded plastic may not be sufficiently moisture resistant in highly humid environments. The present embodiments can provide adequate moisture protection and increase long-term device reliability of over-molded devices. In some cases, dies can be over-molded in addition to including a passivation layer 320.

Although the above embodiments include one or more epitaxial layers 207, the invention is not limited to semiconductor devices that include epitaxial or heteroepitaxial layers. Isolation regions 310, 312 may be formed in monocrystalline, single-semiconductor systems (e.g., Si only) near street boundaries, and passivation layer(s) 320, 322 may be formed over the isolation regions as described above. Integrated circuit devices may also be formed in a same type of semiconductor material as the substrate.

In yet other embodiments, a reliable die coat material, other than silicon nitride, may be used to passivate and/or protect device areas and entirely cover the isolation regions 310, 312 and a portion or all of the streets 110. A reliable die coat material, such as polyimide, may withstand device singulation without cracking. Other die coat materials include, but are not limited to, bisbenzocyclobutene (BCB), polybenzoxazole (PBO), and spin-on glass.

Methods of forming structures near streets on wafers are also contemplated. For example, a method of fabrication may comprise an act of forming one or more isolation regions at a periphery of device areas on a wafer, wherein the one or more isolation regions do not extend entirely across the width of streets on the wafer. A method may also include forming one or more passivation layers that cover the one or more isolation regions and extend into the streets farther than the isolation regions.

Some method embodiments may comprise forming one or more isolation regions at a periphery of device areas on a wafer that lie outside regions covered by one or more passivation layers.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_x In_y Ga_{(1-x-y)}N$), gallium arsenide phosphide nitride ($GaAs_x P_y N_{(1-x-y)}$), aluminum indium gallium arsenide phosphide nitride ($Al_x In_y Ga_{(1-x-y)} As_x P_b N_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials may be doped n-type or p-type, or may be undoped. Suitable gallium-nitride materials are described in U.S. Pat. No. 6,649,287, which is incorporated herein by reference in its entirety. In various embodiments, the surface of a substrate 205 may be monocrystalline, so that a III-nitride (e.g., GaN, AlN, AlGaN, InGaN) or any other suitable crystalline III-V, II-VI, tertiary, or quarternary material may be grown from the surface of the substrate. It will be appreciated that the invention is not limited to only gallium-nitride materials.

When using the terms "on," "adjacent," or "over" in to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

A semiconductor wafer can be embodied in different configurations. Example configurations include combinations of configurations (1) through (11) as described below.

(1) A semiconductor wafer comprising a substrate formed from a first material; a first device area on the semiconductor wafer containing an integrated circuit device; a street extending between the first device area and a second device area; an isolation region extending partially or fully around the integrated circuit device; and one or more passivation layers extending over the isolation region into the street farther than the isolation region extends into the street.

(2) The semiconductor wafer of configuration (1), wherein the one or more passivation layers do not extend to the middle of the street between the first device area and the second device area.

(3) The semiconductor wafer of configuration (1) or (2), wherein the one or more passivation layers do not extend more than 5 microns farther than the isolation region extends into the street.

(4) The semiconductor wafer of any one of configurations (1) through (3), wherein the one or more passivation layers cover at least two intersecting surfaces of the isolation region.

(5) The semiconductor wafer of any one of configurations (1) through (4), wherein the one or more passivation layers comprise silicon nitride, an oxide, or spin-on glass.

(6) The semiconductor wafer of any one of configurations (1) through (5), wherein the one or more passivation layers comprise benzocyclobutene, bisbenzocyclobutene, polybenzoxazole, or polyimide.

(7) The semiconductor wafer of any one of configurations (1) through (6), further comprising epitaxial gallium nitride material formed in the first device area and second device.

(8) The semiconductor wafer of any one of configurations (1) through (7), wherein a width of the street is between 10 microns and 300 microns.

(9) The semiconductor wafer of any one of configurations (1) through (8), wherein the isolation region extends through one or more epitaxial layers towards the substrate.

(10) The semiconductor wafer of any one of configurations (1) through (9), wherein the isolation region comprises implanted nitrogen, argon, boron, or phosphorus.

(11) The semiconductor wafer of any one of configurations (1) through (10), wherein the isolation region does not extend all the way across the street, so that a region of electrical conductivity remains in the street allowing current flow along the street.

A semiconductor die can be embodied in different configurations. Example configurations include combinations of configurations (12) through (18) as described below.

(12) A semiconductor die comprising: a substrate formed from a first material; an integrated circuit device formed on the semiconductor die; an isolation region extending partially or fully around the integrated circuit device; and one or more passivation layers extending over the isolation region toward an edge of the semiconductor die farther than the isolation region extends toward the edge of the semiconductor die.

(13) The semiconductor die of configuration (12), wherein the one or more passivation layers do not extend more than 5 microns farther than the isolation region toward an edge of the die.

(14) The semiconductor die of configuration (12) or (13), wherein the one or more passivation layers comprise silicon nitride, an oxide, or spin-on glass.

(15) The semiconductor die of any one of configurations (12) through (14), wherein the one or more passivation layers comprise benzocyclobutene, bisbenzocyclobutene, polybenzoxazole, or polyimide.

(16) The semiconductor die of any one of configurations (12) through (15), further comprising epitaxial gallium nitride material formed on the semiconductor die.

(17) The semiconductor die of any one of configurations (12) through (16), wherein the isolation region extends through one or more epitaxial layers towards the substrate.

(18) The semiconductor die of any one of configurations (12) through (17), wherein the isolation region comprises implanted nitrogen, argon, boron, or phosphorus.

Methods for making a semiconductor wafer can include various processes. Example methods include combinations of processes (19) through (26) as described below. These methods may be used, at least in part, to make a semiconductor wafer or die of the configurations listed above and below.

(19) A method of forming an integrated circuit device, the method comprising forming an integrated circuit device in a device area on a wafer, wherein the device area is bounded by at least one street; forming an isolation region partially or fully surrounding the integrated circuit device and bordering a first street of the at least one street; and forming at least one passivation layer that covers the isolation region and extends farther toward the first street than the isolation region.

(20) The method of process (19), wherein forming the integrated circuit device comprises forming the integrated circuit device in epitaxial gallium nitride material.

(21) The method of process (19) or (20), wherein forming the isolation region comprises implanting nitrogen, argon, boron, or phosphorus to damage a crystalline semiconductor material.

(22) The method of any one of processes (19) through (21), wherein forming the at least one passivation layer comprises forming a layer of silicon nitride, an oxide, or spin-on glass over the isolation region.

(23) The method of any one of processes (19) through (22), wherein forming the at least one passivation layer comprises forming benzocyclobutene, bisbenzocyclobutene, polybenzoxazole, or polyimide over the isolation region.

(24) The method of any one of processes (19) through (23), wherein forming the at least one passivation layer comprises forming a passivation layer on at least two intersecting surfaces of the isolation region.

(25) The method of any one of processes (19) through (24), further comprising forming an area running along the first street that is not covered by a passivation layer.

(26) The method of any one of processes (19) through (25), further comprising forming an area running along the first street that does not include an isolation region and allows current flow along the first street.

A semiconductor wafer can be embodied in additional different configurations. Example configurations include combinations of configurations (27) through (30) as described below.

(27) A semiconductor wafer comprising a substrate formed from a first material; a first device area on the semiconductor wafer containing an integrated circuit device; a street extending between the first device area and a second device area; one or more passivation layers extending over at least a portion of the integrated circuit device toward the street; and an isolation region extending partially or fully around the first device area and lying entirely outside a region covered by the one or more passivation layers.

(28) The semiconductor wafer of configuration (27), further comprising a portion of the street that does not include the isolation region so that current can flow along the street.

(29) The semiconductor wafer of configuration (27) or (28), further comprising epitaxial gallium nitride material formed in the first device area and second device.

(30) The semiconductor wafer of any one of configurations (27) through (29), wherein the isolation region extends through one or more epitaxial layers.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor wafer comprising:
a substrate formed from a first material;
a first device area on the semiconductor wafer, the first device area containing an integrated circuit device comprising an epitaxial layer formed on the substrate;
a street extending between the first device area and a second device area on the semiconductor substrate, wherein the epitaxial layer extends across the street;
an isolation region formed within the epitaxial layer from a top surface of the epitaxial layer into the epitaxial layer, the isolation region extending partially or fully around the integrated circuit device; and
one or more passivation layers formed over at least a part of the integrated circuit device and extending from the first device area, over the isolation region, and to terminate within the street at a distance into the street farther than the isolation region extends into the street.

2. The semiconductor wafer of claim 1, wherein the one or more passivation layers do not extend to a middle of the street between the first device area and the second device area.

3. The semiconductor wafer of claim 1, wherein:
the isolation region extends into the street; and
the one or more passivation layers do not extend more than 5 microns farther than the isolation region extends into the street.

4. The semiconductor wafer of claim 1, wherein the one or more passivation layers cover at least two intersecting surfaces of the isolation region.

5. The semiconductor wafer of claim 1, wherein the one or more passivation layers comprise silicon nitride, an oxide, or spin-on glass.

6. The semiconductor wafer of claim 1, wherein the one or more passivation layers comprise benzocyclobutene, bis-benzocyclobutene, polybenzoxazole, or polyimide.

7. The semiconductor wafer of claim 1, wherein the epitaxial layer comprises epitaxial gallium nitride material formed in the first device area and the second device area.

8. The semiconductor wafer of claim 1, wherein a width of the street is between 10 microns and 300 microns.

9. The semiconductor wafer of claim 1, wherein:
the epitaxial layer comprises one or more epitaxial layers; and
the isolation region extends from the top surface of the one or more epitaxial layer to a depth into the one or more epitaxial layers towards the substrate.

10. The semiconductor wafer of claim 1, wherein the isolation region comprises nitrogen, argon, boron, or phosphorus implanted into the epitaxial layer.

11. The semiconductor wafer of claim 1, wherein:
the isolation region is electrically insulating as compared to the epitaxial layer; and
the isolation region does not extend across the street, so that a region of electrical conductivity remains in the street allowing current flow along the street.

12. A semiconductor die comprising:
a substrate formed from a first material;
an integrated circuit device formed on the semiconductor die and comprising an epitaxial layer;
an isolation region formed within the epitaxial layer from a top surface of the epitaxial layer into the epitaxial layer, the isolation region extending partially or fully around the integrated circuit device; and
one or more passivation layers formed over at least a part of the integrated circuit device and extending to a distance beyond the isolation region toward an edge of the semiconductor die farther than the isolation region extends toward the edge of the semiconductor die, the one or more passivation layers terminating before the edge of the semiconductor die.

13. The semiconductor die of claim 12, wherein the one or more passivation layers do not extend more than 5 microns farther than the isolation region toward an edge of the semiconductor die.

14. The semiconductor die of claim 12, wherein the one or more passivation layers comprise silicon nitride, an oxide, or spin-on glass.

15. The semiconductor die of claim 12, wherein the one or more passivation layers comprise benzocyclobutene, bis-benzocyclobutene, polybenzoxazole, or polyimide.

16. The semiconductor die of claim 12, wherein the epitaxial layer comprises epitaxial gallium nitride material formed on the semiconductor die.

17. The semiconductor die of claim 12, wherein:
the epitaxial layer comprises one or more epitaxial layers; and
the isolation region extends from the top surface of the one or more epitaxial layers to a depth into the one or more epitaxial layers towards the substrate.

18. The semiconductor die of claim 12, wherein the isolation region comprises nitrogen, argon, boron, or phosphorus implanted into the epitaxial layer.

* * * * *